(12) United States Patent
Bhatia et al.

(10) Patent No.: US 7,710,155 B2
(45) Date of Patent: May 4, 2010

(54) DYNAMIC DUAL OUTPUT LATCH

(75) Inventors: Ajay Bhatia, Santa Clara, CA (US); Uttam Saha, Cupertino, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 11/738,287

(22) Filed: Apr. 20, 2007

(65) Prior Publication Data

US 2008/0258788 A1    Oct. 23, 2008

(51) Int. Cl.
*H03K 19/00* (2006.01)
*H03K 19/096* (2006.01)

(52) U.S. Cl. .......................... 326/93; 326/98; 327/218

(58) Field of Classification Search .................. 326/40, 326/93–98; 327/218, 215
See application file for complete search history.

(56) References Cited

U.S. PATENT DOCUMENTS

| | | | | |
|---|---|---|---|---|
| 3,588,546 A | * | 6/1971 | Lagemann | 327/215 |
| 5,760,610 A | * | 6/1998 | Naffziger | 326/93 |
| 6,081,136 A | * | 6/2000 | Khanna et al. | 326/95 |
| 6,310,499 B1 | * | 10/2001 | Radjassamy | 327/175 |
| 6,323,710 B1 | * | 11/2001 | Piguet et al. | 327/218 |
| 6,603,333 B2 | * | 8/2003 | Vinh et al. | 326/98 |
| 6,791,361 B2 | * | 9/2004 | Alon et al. | 326/93 |
| 6,960,941 B2 | * | 11/2005 | Cantin et al. | 327/57 |
| 7,282,957 B2 | * | 10/2007 | Sumita | 326/96 |
| 2004/0263229 A1 | * | 12/2004 | Minzoni | 327/215 |
| 2006/0022717 A1 | * | 2/2006 | Park | 327/2 |
| 2008/0130396 A1 | * | 6/2008 | Gomm et al. | 365/233.11 |
| 2008/0258775 A1 | * | 10/2008 | Wendell | 326/121 |

* cited by examiner

*Primary Examiner*—James H. Cho
*Assistant Examiner*—Jason Crawford
(74) *Attorney, Agent, or Firm*—Osha • Liang LLP

(57) ABSTRACT

A dynamic latch includes a first stage for receiving an input data value and for providing true and complement logic values representing the input data value; a second stage for receiving the true and complement logic values into first and second dynamic node, when a control signal is active; and a holding that outputs the true and complement logic values while the control signal is active. The second stage may provide a feedback signal to the first stage to block propagation of changes in the input data value after the true and complement logic values have been received. The feedback signal may be derived, for example, from logic values on the dynamic nodes. A holding circuit may be provided.

16 Claims, 1 Drawing Sheet

DYNAMIC DUAL OUTPUT LATCH

BACKGROUND OF THE INVENTION

A latch is typically the first stage of a register element. In a dynamic or a timing-critical application, dual monotonic signal outputs are required. "Monotonic" refers to a data transition characteristic of the output signals of the latch. The output signals are "monotonic" when exactly one of these output signals transitions, and transitions only once, during a given clock phase. A clock-gated dynamic latch has the desired behavior, but has the drawback of using ratioed logic. That is, to allow the latch to be written into, one of the cross-coupled devices is provided a lesser output drive capability, so that the new data can overwrite the existing data by contending with and overcoming the drive strength of this lesser drive capability. In the ratioed logic circuit, a pull-down NMOS device is required to pull a dynamic node to ground reference (i.e., voltage $V_{ss}$) over PMOS pull-up devices ("keeper device") that attempts to drive the dynamic node to the supply voltage (i.e., voltage $V_{dd}$). Consequently, ratioed logic circuits require larger pull-down devices. Therefore, greater power and area than desired are required.

Ratioed logic suffers from a number of disadvantages. First, the contention between pull-up PMOS transistors or pull-down NMOS transistors during the write process dissipates power. Second, the contention present when the latch is written into requires time to resolve, hence affecting evaluation time performance, thus slowing circuit operation. Ratioed logic also does not scale well over a large range of operating voltages, and tends to fail more frequently at the lower end of the operating voltages. In addition, ratioed logic circuits are sensitive to variations in process parameter values, and are therefore susceptible to failure modes relating to process variations.

SUMMARY

According to one embodiment of this invention, a dynamic latch includes a first stage for receiving an input data value and for providing true and complement logic values representing the input data value; a second stage for receiving the true and complement logic values into first and second dynamic nodes, when a control signal is active; and a holding circuit that outputs the true and complement logic values while the control signal is active. The second stage may provide a feedback signal to the first stage to block propagation of changes in the input data value after the true and complement logic values have been received. The feedback signal may be derived, for example, from logic values on the dynamic nodes. The holding circuit may include cross-coupled logic gates receiving as input the true and complement data values from the first and second dynamic nodes, and the logic values on the dynamic nodes may be driven by an output circuit as the output of the dynamic latch, so as to provide dual output values.

This invention is better understood upon consideration of the detailed description below in conjunction with the accompanying drawings.

DETAILED DESCRIPTION OF THE PREFERRED EMBODIMENTS

Figure 1:
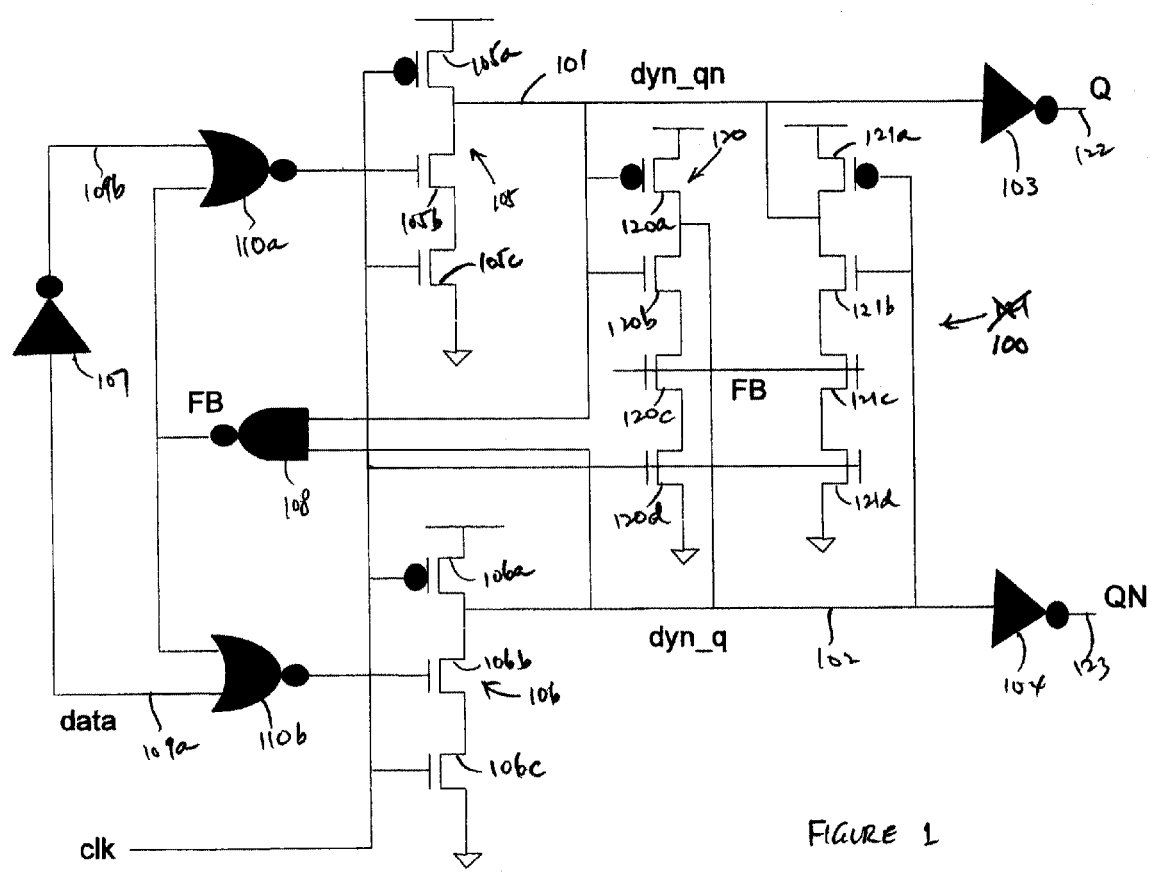
FIG. 1 shows monotonic dual-output flip-flop 100, according to one embodiment of the present invention.

This invention provides a latch which includes a first stage for receiving an input data bit and a second stage for providing the data bit received in true and complement forms at two output dynamic nodes. In addition, a holding circuit may be provided to hold the output values of the dynamic nodes. The second stage provides a feedback signal to the first stage to block propagation of subsequent changes in the input data value after the full logic states are achieved at the dynamic nodes. The dynamic latch of this invention does not have ratioed logic contention. By avoiding ratioed logic contention, a latch of this invention may operate in very low operating voltages, and may use smaller transistors, thereby reducing power and area requirements.

FIG. 1 shows monotonic dual-output latch or flip-flop 100, according to one embodiment of the present invention. As shown in FIG. 1, flip-flop 100 includes dynamic nodes 101 and 102 driven by dynamic clocked stacks 105 and 106. Dynamic clocked stacks 105 and 106 each includes a PMOS transistor (i.e., PMOS transistor 105a or 106a) and an NMOS transistor (i.e., NMOS transistor 105c or 106c) controlled by a control signal (i.e., control signal CLK). Dynamic clocked stacks 105 and 106 each further include an input transistor (i.e., input transistor 105b or 106b) that receives a single-bit data input. The logic values received by input transistors 105b and 106b are complementary because of inverter 107.

When control signal CLK is not active (i.e., at logic '0' or LOW), PMOS transistors 105a and 106a precharge dynamic nodes 101 and 102 to supply voltage V.sub.dd. As a result, NAND gate 108 provides a logic '0' output value (i.e., signal FB is at logic '0'), thereby allowing the complementary input logic values at terminals 109a and 109b to propagate through NOR gates 110a and 110b, respectively.

When control signal CLK becomes active (i.e., asserted, at logic '1' or HIGH), PMOS transistors 105a and 106a are turned off, and NMOS transistors 105c and 106c become conducting. Dynamic clocked stacks 105 and 106 therefore evaluate the input signals at dynamic nodes 101 and 102. As the data bits at the gate terminals of input transistors 105b and 106b are complementary, exactly one of dynamic nodes 101 and 102 is discharged to the ground reference. NAND gate 108 then provides a logic '1' value output, thereby blocking propagation of any subsequent change in input data value at terminals 109a and 109b. At the same time, one of PMOS transistors 120a and 121a in cross-coupled NAND gates 120 and 121 becomes conducting, as a result of the corresponding one of nodes 101 and 102 having discharged.

At this time, signal FB (now having a logic '1' value) renders NMOS transistors 120c and 120d conducting, while control signal CLK renders NMOS transistors 120d and 121d conducting. Thus, the discharged one of dynamic nodes 101 and 102 is held to the ground reference by the action of corresponding NMOS transistor 120b or 121b, while the undischarged one of dynamic nodes 101 and 102 is held to supply voltage $V_{dd}$ by the action of the conducting one of PMOS transistors 120a and 120b. Thus, cross-couple NAND gates 120 and 121 form a holding circuit for the output logic values until control signal CLK becomes inactive (i.e., deasserted). Complementary output values are driven by inverting drivers 103 and 104 onto terminals 122 and 123.

The holding circuit of NAND gates 120 and 121 turns on as one of dynamic nodes 101 and 102 discharges. Unlike the ratioed logic at the output nodes of prior art latches, contention exists in neither dynamic node 101 nor dynamic node 102. Accordingly, power dissipation due to contention at the holding circuit is avoided. The feedback signal FB is asserted only after dynamic nodes 101 and 102 achieve full logic values.

Accordingly, output flip-flop 100 provides dual output values. When control signal CLK is not active, the output values of flip-flop 100 are pre-charged to logic value '1' for evaluation in the next cycle.

As shown in FIG. 1, flip-flop 100 has a two-gate delay from clock transition to output, which is a desirable timing characteristic suitable for use in a critical path. Since ratioed logic contention is not present, flip-flop 100 can operate at very low operating voltages. In addition, without ratioed logic contention, smaller NMOS pull-down devices can be used to implement flip-flop 100, thereby providing power and area savings.

During hold mode (i.e., when feedback signal FB is at logic value '1'), the holding circuit of NAND gates 120 and 121 maintains dynamic nodes 101 and 102 even though various sources of charge leakage may exist. Flip-flop 100 uses only a single clock signal, obviating the need for complementary clock signals to achieve storage. Because the holding circuit is turned off when data is sampled, there is little power loss due to crowbar currents.

In one example, latch 100 is implemented using the following components, provided here for illustrative purpose (all transistors have a channel length of 60 nm):

| DEVICE | WIDTH (μm) |
|---|---|
| Inverter 107 | 0.25 (NMOS) 0.5 (PMOS) |
| NAND 108 | 0.6 (NMOS) 1.2 (PMOS) |
| NOR gates 110a and 110b | 0.3 (NMOS) 1.2 (PMOS) |
| PMOS 105a and 106a | 0.7 |
| NMOS 105b and 106b | 1.0 |
| NMOS 105c and 106c | 2.0 |
| PMOS 120a and 121a | 0.3 |
| NMOS 120b, 120c, 120d, 121b, 121c and 121d | 0.5 |
| INVERTERS 103 and 104 | 1.0 (NMOS) 3.0 (PMOS) |

A latch of this invention is especially suitable for use, for example, in (a) the address or command decode circuits for static random access memories (SRAMs), read-only memories (ROMs) and register files; (b) any dynamic circuit, such as various types of comparators; (c) content addressable memories (CAMs) and ternary CAMs (TCAMs); (d) fast adders, arithmetic logic units (ALUs), Booth coder/decoders for Booth multipliers; (e) any decoding circuit, and (f) synchronizer circuits. For example, in the address and command decode circuits of SRAMs, ROMs or register files, a latch of this invention provides complimentary monotonic data which speeds up read/write accesses and lowers power dissipation, In CAM or TCAM applications, the registers elements of the present invention provides the required monotonic results in comparisons of key data. In adders and ALU applications, the register elements of this invention allow operands to be stored and output as dual rail domino signals, thus allowing interface with dual dynamic domino logic circuits often found in these same applications. In general, the registers of this invention allows lower power, smaller silicon area and low-voltage operations.

Using transistor models for a 90 nm CMOS manufacturing process, simulation results from a SPICE simulator show that flip-flop 100 can operate from a 0.95 volts operating voltage at 3 GHz down to a 0.25 volts operating voltage at 200 MHz.

The hardware described above, including any logic or transistor circuit, may be generated automatically by computer based on a description of the hardware expressed in the syntax and the semantics of a hardware description language, as known by those skilled in the art. Applicable hardware description languages include those provided at the layout, circuit netlist, register transfer, and schematic capture levels. Examples of hardware description languages include GDS II and OASIS (layout level), various SPICE languages and IBIS (circuit netlist level), Verilog and VHDL (register transfer level) and Virtuoso custom design language and Design Architecture-IC custom design language (schematic capture level). The hardware description may also be used, for example, in various behavior, logic and circuit modeling and simulation purposes.

The above detailed description is provided to illustrate specific embodiments of this invention and is not intended to be limiting. Numerous variations and modifications within the scope of this invention are possible. This invention is set forth in the following claims.

We claim:

1. A latch, comprising:
   a first stage for receiving an input data value and a feedback signal, and for providing, when the feedback signal is deasserted, true and complement logic values representing the input data value, wherein the input data value is independent of a control signal;
   a second stage for receiving, when the control signal is active, the true and complement logic values into first and second dynamic nodes, and for asserting the feedback signal thereafter; and
   a holding circuit that outputs the true and complement logic values while the control signal is active, wherein the holding circuit is turned off while the control signal is inactive.

2. A latch as in claim 1, wherein the second stage deasserts the feedback signal when the control signal is inactive.

3. A latch as in claim 1, wherein the asserted feedback signal blocks propagation of changes in the input data value to the second stage.

4. A latch as in claim 1, wherein the holding circuit comprises cross-coupled logic gates receiving as input the true and complement data values from the first and second dynamic nodes.

5. A latch as in claim 1, further comprising output logic gates for providing, as output of the dynamic latch, the logic values on the dynamic nodes.

6. The latch of claim 1, wherein the first stage includes a plurality of gates receiving the feedback signal, and wherein the feedback signal to at least two of the plurality of gates is the same signal.

7. A method for providing a dynamic latch, comprising:
   receiving, when a feedback signal is deasserted, an input data value into a first stage from which true and complement logic values representing the input data value are provided, wherein the input data value is independent of a control signal;
   receiving, when the control signal is active, the true and complement logic values into first and second dynamic nodes of a second stage;
   asserting the feedback signal after the true and complement logic values are received into the first and second dynamic nodes; and
   holding and outputting the true and complement logic values, using a holding circuit, while the control signal is active, wherein the holding circuit is turned off while the control signal is inactive.

8. A method as in claim 7, further comprising a deasserting feedback signal when the control signal is inactive.

9. A method as in claim 7, wherein the feedback signal blocks propagation of changes in the input data value to the second stage.

10. A method as in claim 7, wherein the holding circuit comprises cross-coupled logic gates receiving as input the true and complement data values from the first and second dynamic nodes.

11. A method as in claim 7, further comprising providing as output of the dynamic latch the logic values on the dynamic nodes.

12. The method of claim 7, wherein the first stage includes a plurality of gates receiving the feedback signal, and wherein the feedback signal to at least two of the plurality of gates is the same signal.

13. A latch comprising:
means for receiving an input data value and a feedback signal in a first stage and for providing, when the feedback signal is deasserted, true and complement logic values representing the input data value, wherein the input data value is independent of a control signal;
means for receiving the true and complement logic values in a second stage into first and second dynamic nodes when the control signal is active; and
means for holding and outputting the true and complement logic values, while the control signal is active,
wherein inputs to the latch consist of the input data and the control signal.

14. A latch as in claim 13, wherein the feedback signal is asserted in the second stage and returns to the first stage to block propagation of changes in the input data value after the true and complement logic values have been received.

15. The latch of claim 13, wherein the first stage includes a plurality of gates receiving the feedback signal, and wherein the feedback signal to at least two of the plurality of gates is the same signal.

16. A computer-readable medium containing a description expressed in a hardware description language which is interpreted by a computer to specify a latch comprising:
a first stage for receiving an input data value and a feedback signal, and for providing true and complement logic values representing the input data value, when the feedback signal is deasserted;
a second stage for receiving the true and complement logic values into first and second dynamic nodes, when a control signal is active, and thereafter for asserting the feedback signal; and
a keeper circuit for holding and outputting the true and complement logic values while the control signal is active,
wherein inputs to the latch consist of the input data and the control signal.

* * * * *

UNITED STATES PATENT AND TRADEMARK OFFICE
CERTIFICATE OF CORRECTION

PATENT NO. : 7,710,155 B2
APPLICATION NO. : 11/738287
DATED : May 4, 2010
INVENTOR(S) : Ajay Bhatia et al.

It is certified that error appears in the above-identified patent and that said Letters Patent is hereby corrected as shown below:

In column 4, line 66, in claim 8, delete "a deasserting" and insert -- deasserting --, therefor.

Signed and Sealed this
Twelfth Day of April, 2011

David J. Kappos
*Director of the United States Patent and Trademark Office*